Feb. 13, 1962 G. D. BRUCE 3,021,432

NON-CUTOFF TRANSISTOR SWITCHING CIRCUIT

Filed Dec. 31, 1957

INVENTOR
GEORGE D. BRUCE

BY Lester W. Clark

ATTORNEY

United States Patent Office 3,021,432
Patented Feb. 13, 1962

3,021,432

NON-CUTOFF TRANSISTOR SWITCHING CIRCUIT

George D. Bruce, Poughkeepsie, N.Y., assignor to International Business Machines Corporation, New York, N.Y., a corporation of New York
Filed Dec. 31, 1957, Ser. No. 706,394
3 Claims. (Cl. 307—88.5)

This invention relates to transistor circuits, and especially to so-called "large signal" amplifier or switching circuits which shift quickly between a low current OFF condition and a high current ON condition in response to an input signal having a steep front.

It has been common in transistor switching circuits of the prior art to establish the low current OFF condition by operating the transistor in the cutoff region of its output characteristic. A substantial time is required for such a circuit to respond to an input signal by operating the transistor from its cutoff condition to the ON condition where it carries substantial current.

It has been proposed, in order to speed up the response of such a circuit, to arrange the circuit so it does not operate in the cutoff region of the transistor characteristic. Such a circuit is known as a non-cutoff circuit.

An object of the invention is to provide an improved non-cutoff transistor switching circuit.

Another object is to provide an improved circuit of the type described in which one transistor serves as the amplifying transistor, and in which a second transistor is utilized to provide a feedback during the OFF condition of the first transistor to maintain the first transistor outside the cutoff region of its output characteristic.

The foregoing and other objects of the invention are attained by the circuits described herein. Each circuit comprises a first, or main transistor which is connected as a grounded emitter amplifier. A second transistor, having complementary symmetry with the main transistor, has its emitter connected to the collector of the first transistor and its collector connected to the base of the first transistor. This second transistor is effective when the first transistor is OFF, to supply a limited amount of feedback current to the base of the first transistor. This current flow is controlled to maintain the first transistor outside the cutoff region of its characteristic.

Other objects and advantages of the invention will become apparent from a consideration of the following specification and claims, taken together with the accompanying drawing.

Figure 1:
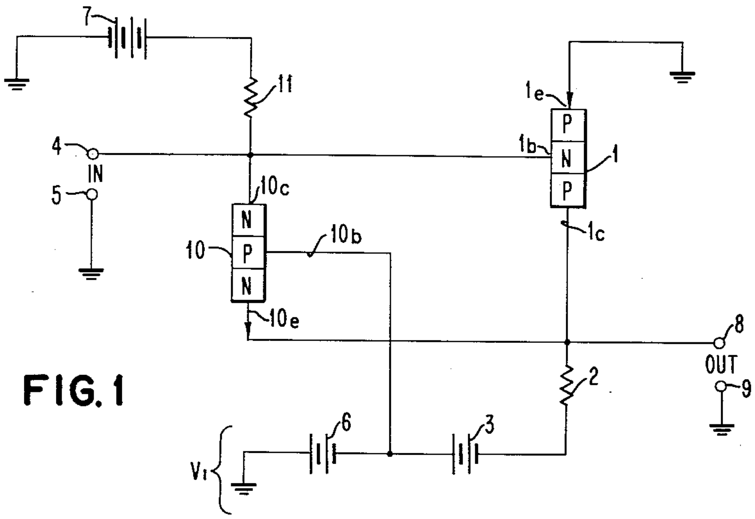
FIG. 1 is a wiring diagram of a switching circuit embodying the invention.

Referring to FIG. 1, there is shown a switching circuit, or "large signal" amplifier which includes a main transistor 1, of the PNP junction type, having an emitter electrode 1*e*, a base electrode 1*b* and a collector electrode 1*c*. Collector electrode 1*c* is connected through resistor 2 and batteries 3 and 6 to ground. Base electrode 1*b* is connected through input terminals 4 and 5 to ground. Emitter electrode 1*e* is connected to ground. Output terminals 8 and 9 are connected respectively to collector 1*c* and to ground. A feedback transistor 10, of the NPN junction type has an emitter 10*e*, a base electrode 10*b*, and a collector electrode 10*c*. Emitter electrode 10*e* is provided with a direct conductive connection to the collector 1*c*. Collector 10*c* is provided with a direct conductive connection to the base electrode 1*b*. Collector 10*c* is also connected through a resistor 11 to the positive terminal of battery 7. Base electrode 10*b* is connected to the junction between batteries 3 and 6.

The battery 7 reversely biases the collector-base impedance of the transistor 10. Battery 7, together with the potential drop across 11 reversely biases the emitter-base impedance of transistor 1. Battery 3 reversely biases the collector-base impedance of transistor 1 and forwardly biases the base-emitter impedance of transistor 10.

When no input signal is received at the terminals 4 and 5, the current flowing through the collector of transistor 10 produces a potential drop across resistor 11, which potential drop controls the magnitude of the forward emitter-base bias on transistor 1. As the current flow through collector 10*c* increases, the emitter-base bias on transistor 1 increases until it becomes forward conducting, and hence the current flow through collector 1*c* increases. The potential drop across resistor 2 increases, but the effect of this potential drop is to decrease the emitter-base bias on transistor 10, thereby decreasing the current flow through the collector 10*c*, and hence decreasing the forward emitter-base bias on transistor 1. Conversely, this decreases the current flow through collector 1*c*, which decreases the potential drop across resistor 2, thereby increasing the forward emitter-base bias on transistor 1.

The connection between the output of transistor 1 and the input of transistor 10 may be described as a degenerative feedback, since an increase in the output current of transistor 1 tends to decrease the output current of transistor 10. On the other hand, the connection between the output of transistor 10 and the input of transistor 1 is a regenerative feedback, since an increase in the output current of transistor 1 tends to increase the output current of transistor 10.

The conditions tend to balance themselves. If the current through collector 1*c* increases, then the potential drop across resistor 2 increases, thereby swinging the potential of emitter 10*e* more positive and tending to reduce the current flow through transistor 10. This reduction in the current flow correspondingly reduces the input current to the transistor 1 and consequently reduces its output current. By properly selecting the values of the various resistors concerned, a condition may be established wherein the output current of transistor 1, with no input signal, is at any desired level. In the present instance, it is desired to maintain that output current level outside the cutoff region of the transistor characteristic and to have the output potential clamped at the potential of battery 6.

When a square wave input signal of negative polarity is received at the input terminals 4 and 5, the current flow through the emitter-base impedance of transistor 1 is greatly increased and the output current through collector 1*c* is greatly increased, the transistor 1 then being shifted to its ON condition. The potential drop across resistor 2 increases and the transistor 10 then cuts off. The output signal appearing at terminals 8 and 9 is measured by the increase in the current flow through resistor 2 and the consequent increase in the potential drop across it. In other words, it may be stated that the feedback transistor 10 cooperates with battery 3 and resistor 2 to clamp both the collector current and the collector potential of transistor 1 at values outside the cutoff region.

Figure 2:
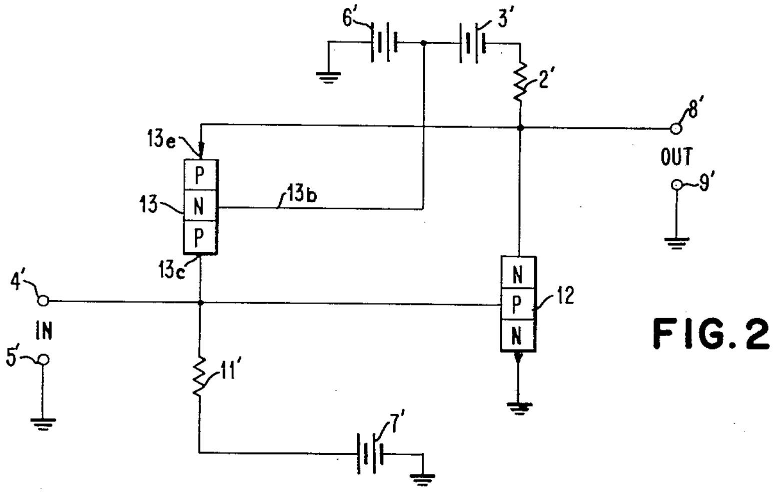
FIG. 2 is a wiring diagram of a modified form of a switching circuit embodying the invention.

FIG. 2 shows a circuit which is the equivalent of that shown in FIG. 1, except that the main transistor is an NPN transistor 12, in place of the PNP transistor 1 of FIG. 1. Similarly, the feedback transistor in FIG. 2 is a PNP transistor 13, and corresponds in function to the NPN transistor 10 of FIG. 1. The other elements in FIG. 2 have been given primed reference numerals corresponding to the reference numerals of their counterparts in FIG. 1. It will be recognized by those skilled in the art that changes may be made in the battery potential and in the resistance values for the circuit elements of FIG. 2 as compared to their counterparts in FIG. 1.

The table below shows suggested values of resistances and battery potentials for the circuits of FIGS. 1 and 2:

| | | |
|---|---|---|
| Resistor **2** | ohms | 3,000 |
| Battery **3** | volts | —15 |
| Battery **6** | do | —5 |
| Battery **7** | do | +10 |
| Resistor **11** | ohms | 10,000 |
| Resistor **2'** | do | 3,000 |
| Battery **3'** | volts | +15 |
| Battery **6'** | do | +5 |
| Battery **7'** | do | —10 |
| Resistor **11'** | ohms | 10,000 |

Figure 3:
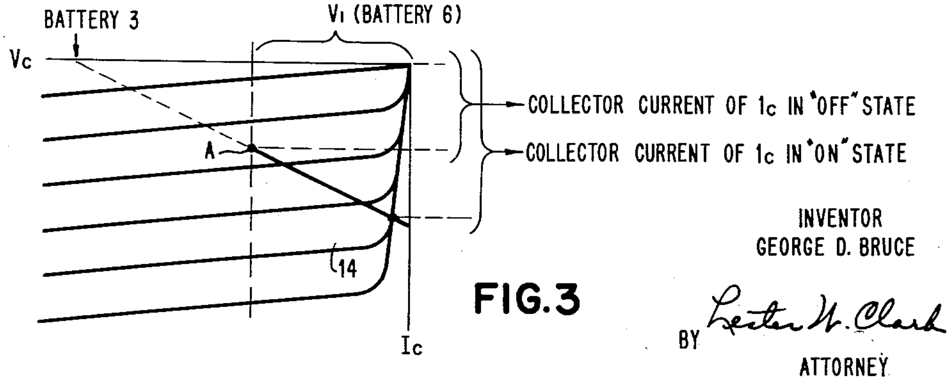
FIG. 3 is a graphical illustration of the output characteristics of the main transistor in the circuit of FIG. 1.

FIG. 3 illustrates graphically the operation of the transistor 1 of FIG. 1. There is shown in this figure a family of collector voltage-current characteristics on which is superimposed a load line 14, whose slope represents the impedance of resistor 2. The upper end of the load line is terminated at a point A, outside the cutoff region of the transistor. The location of the point A is determined by the selection of the resistors in the circuit and the balance attained between the load current through resistor 2 and the feedback current through the emitter 10*e* of transistor 10.

While I have shown and described certain preferred embodiments of my invention, other modifications thereof will readily occur to those skilled in the art and I therefore intend my invention to be limited only by the appended claims.

I claim as my invention:

1. A transistor switching circuit comprising first and second transistors having complementary symmetry with each other, each transistor having input and output electrodes, a direct current conductive degenerative feedback connection between the output electrode of the first transistor and the input electrode of the second transistor, a direct current conductive regenerative feedback connection between the output electrode of the second transistor and the input electrode of the first transistor, said feedback connections being effective to balance one another and establish an OFF state of the circuit in which said second transistor carries a substantial output current and the output current of the first transistor is larger than the cutoff output current of said first transistor, signal input means connected to the input electrode of the first transistor and shiftable rapidly between a no-signal condition in which said OFF state is established by said feedback connections, and a signal condition substantially separated from said no-signal condition in which the first transistor produces an ON output current substantially increased from its OFF value, and the second transistor is cut off, and means for taking an output signal from the output electrode of the first transistor.

2. A transistor switching circuit comprising first and second transistors having complementary symmetry with each other, each transistor having input, output and common electrodes, means directly conductively connecting the output electrode of the first transistor to the input electrode of the second transistor, means directly conductively connecting the output electrode of the second transistor to the input electrode of the first transistor, means directly conductively connecting the common electrode of the first transistor to a common junction, a first source of direct current, a first resistor, means connecting the first source and the first resistor in series between the common junction and the output electrode of the second transistor, said resistor, source and connecting means cooperating to form a regenerative feedback between the second transistor and the first transistor, means directly conductively connecting the common electrode of the second transistor to a source of fixed potential, a second source of direct current, a second resistor, and means connecting the second source and the second resistor in series between said source of fixed potential and the output electrode of the first transistor, said second source and said second resistor cooperating with their associated connections to form a degenerative feedback between the first transistor and the second transistor, said first and second sources and resistors being proportioned to establish an OFF state of the circuit outside the cutoff region of the first transistor.

3. A transistor switching circuit comprising first and second junction transistors having complementary symmetry with each other, each transistor having a base electrode, an emitter electrode, and a collector electrode, a direct conductive connection between the base electrode of said first transistor and the collector electrode of the second transistor, a second direct conductive connection between the collector electrode of the first transistor and the emitter electrode of the second transistor, means connecting the emitter electrode of the first transistor to a common junction, first direct current supply means having one terminal connected to said junction, a first resistor connecting the other terminal of said first direct current supply means to the collector electrode of the second transistor and to the base electrode of the first transistor, said resistor providing a regenerative feedback between the second and first transistors, means connecting the base electrode of the second transistor to a source of fixed potential, second direct current supply means having one terminal connected to said source, a second resistor connected between the other terminal of said second direct current supply means and a second common junction with the collector electrode of the first transistor and the emitter electrode of the second transistor, the base-emitter impedance electrode of the second transistor cooperating with said source of fixed potential to clamp the collector of said first transistor at an OFF potential outside the cutoff region, said second resistor being effective to feed back degeneratively through the base-emitter impedance of the first transistor and cooperating with the regenerative feedback of said first resistor to hold the output current of said first transistor outside the cutoff region.

References Cited in the file of this patent

UNITED STATES PATENTS

| | | |
|---|---|---|
| 2,591,961 | Moore et al. | Apr. 8, 1952 |
| 2,823,322 | Trousdale | Feb. 11, 1958 |
| 2,825,821 | Logue | Mar. 4, 1958 |
| 2,827,574 | Schneider | Mar. 18, 1958 |
| 2,828,450 | Pinckaers | Mar. 25, 1958 |
| 2,829,257 | Root | Apr. 1, 1958 |
| 2,831,126 | Linvill et al. | Apr. 15, 1958 |
| 2,900,456 | Davidson | Aug. 18, 1959 |
| 2,939,040 | Isabeau | May 31, 1960 |

FOREIGN PATENTS

| | | |
|---|---|---|
| 529,905 | Italy | Dec. 13, 1954 |

UNITED STATES PATENT OFFICE
CERTIFICATE OF CORRECTION

Patent No. 3,021,432 February 13, 1962

George D. Bruce

It is hereby certified that error appears in the above numbered patent requiring correction and that the said Letters Patent should read as corrected below.

Column 4, line 44, strike out "electrode".

Signed and sealed this 5th day of June 1962.

(SEAL)
Attest:

ERNEST W. SWIDER
Attesting Officer

DAVID L. LADD
Commissioner of Patents